US006792372B2

(12) United States Patent
Lee (10) Patent No.: US 6,792,372 B2
(45) Date of Patent: *Sep. 14, 2004

(54) METHOD AND APPARATUS FOR INDEPENDENT OUTPUT DRIVER CALIBRATION (75) Inventor: Terry R. Lee, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/268,959

(22) Filed: Oct. 11, 2002

(65) Prior Publication Data

US 2003/0033107 A1 Feb. 13, 2003

Related U.S. Application Data (60) Continuation of application No. 09/983,905, filed on Oct. 26, 2001, now Pat. No. 6,480,798, which is a division of application No. 09/599,559, filed on Jun. 23, 2000, now Pat. No. 6,333,639.

(51) Int. Cl.[7] .......................... G06F 19/00; G01R 35/00
(52) U.S. Cl. ......................... 702/107; 327/108; 326/30
(58) Field of Search .................. 702/107; 327/108; 326/30

(56) References Cited

U.S. PATENT DOCUMENTS 5,221,865 A    6/1993   Philipps et al.
5,414,379 A    5/1995   Kwon
5,621,335 A    4/1997   Andresen
5,632,019 A    5/1997   Masiewicz
5,666,078 A    9/1997   Lamphier et al.
5,727,166 A    3/1998   Klinck
5,844,425 A   12/1998   Nguyen et al.
5,917,758 A    6/1999   Keeth
5,926,651 A    7/1999   Johnston et al.
6,009,487 A   12/1999   Davis et al.
6,326,810 B1  12/2001   Keeth
6,330,194 B1  12/2001   Thomann et al.
6,333,639 B1 * 12/2001  Lee .............................. 326/30
6,480,798 B2 * 11/2002  Lee ............................. 702/107
6,549,036 B1 *  4/2003  Lee .............................. 326/83
2001/0000951 A1 5/2001  Welch et al.

* cited by examiner

Primary Examiner—Patrick Assouad
(74) Attorney, Agent, or Firm—Dickstein Shapiro Morin & Oshinsky LLP (57) ABSTRACT An apparatus and method for independently adjusting or calibrating the characteristics of multiple drivers for output buffer circuits without significantly increasing the associated necessary circuitry is disclosed. A central control logic circuit initiates the calibration process of the drivers. A serial communication link is provided between the control logic and each of the output drivers. The serial link reduces the number of lines that are required to communicate between the central control logic and the multiple output drivers. The output drivers can be calibrated one at a time, and a handoff is made from one driver to the next to start the calibration of the subsequent driver.

15 Claims, 7 Drawing Sheets

METHOD AND APPARATUS FOR INDEPENDENT OUTPUT DRIVER CALIBRATION

This application is a continuation of application Ser. No. 09/983,905, filed Oct. 26, 2001 (now U.S. Pat. No. 6,480,798), which is a divisional of application Ser. No. 09/599,559, filed Jun. 23, 2000 (now U.S. Pat. No. 6,333,639 B1), the subject matter of which is incorporated by reference herein.

BACKGROUND OF THE INVENTION

1. Field of the Invention

The present invention relates generally to input/output circuits in integrated circuits (ICs), and more particularly to an apparatus and method for adjusting output buffer driver characteristics with a serial communication link between the control logic and each output buffer driver in the system.

2. Description of the Related Art

In an integrated circuit, input/output buffer circuits are often provided between the integrated circuit and the external environment, i.e., the system in which the integrated circuit is placed. The buffer circuits interface input/output signals to/from the external environment, typically a system bus or interconnect cable. Two characteristics of buffer circuits are slew rate (sometimes called edge rate) and buffer driver strength. The slew rate of a buffer is the rate of change of a voltage signal furnished at the output terminal of the buffer with respect to time. The buffer drive strength is the current/voltage characteristic of an output device of the buffer in producing the particular voltage level of an output signal. The drive strength of the buffer and the slew rate are chosen to meet the characteristics of the circuitry with which the buffer is associated.

Output buffer circuits are generally used in semiconductor memory devices such as dynamic random access memory (DRAM), static random access memory (SRAM), read only memory (ROM) and the like.

In high-speed signaling systems, an output buffer calibration scheme is utilized to reduce timing uncertainties in these systems. In a bussed system, i.e., a system where there are several different devices that may drive the bus or where there are several different devices that drive a portion of a wide bus, output buffer calibration schemes are particularly important to reduce timing uncertainties. Calibrated output drivers in the buffer circuits reduce the timing uncertainty by matching drivers from one device to another, by matching the characteristics of the pull-up transistor, i.e., the transistor that drives a high voltage, to the characteristics of the pull-down transistor, by setting an effective output impedance that helps to back-terminate transmission line reflections in the bus system, and by limiting the output voltage slew rates to improve the signal integrity. Some of the benefits obtained by calibrated output buffers can be achieved by closely specifying the driver characteristics for all devices in the system. Techniques such as specifying minimum and maximum output currents, specifying the current versus voltage curves with minimum and maximum limits, and providing limits on the minimum and maximum slew rates have been used.

A problem with the above described calibration techniques is that they are unable to adjust for the effects of manufacturing process variances, applied voltage variations and/or temperature variations. As such, active calibration schemes that can further reduce the timing uncertainty by adjusting for the effects of process variance, voltage variation and/or temperature variation have been developed. Multiple drivers of a device can be adjusted simultaneously by providing the same adjustment commands to all drivers, or by providing an adjustment value that is used by all drivers. A further level of timing accuracy can be obtained by adjusting each driver independently of the others. With this method, drive strength differences between transistors on a device can be compensated for, and differences in transistor power and ground differences, typically caused by IR drops on the power or ground bus, can also be compensated for.

There are problems, however, with the conventional independent driver calibration schemes. Since each driver is independently calibrated, additional complex control logic for each driver is required, thus increasing the cost and size of the integrated circuit. Additionally, the number of control lines necessary to address each driver on the device can be large in some applications, such as bus controllers or memory controllers, thus further increasing the cost and size of the integrated circuit.

Thus, there exists a need for an apparatus and method for independently calibrating the characteristics of multiple output drivers of an integrated circuit that does not require significant additional circuitry to implement.

SUMMARY OF THE INVENTION

The present invention alleviates many of the problems associated with the prior art and provides an apparatus and method for independently adjusting or calibrating output driver characteristics without significantly increasing the associated necessary circuitry.

In accordance with one aspect of the present invention, a serial communication link is provided between a central control circuit and a driver control circuit for each of the output drivers. The serial link reduces the number of lines that are required to communicate between the central control logic and the multiple output drivers. The output drivers can be calibrated one at a time, and a handoff is made from one driver to the next to start the calibration of the subsequent driver.

In accordance with another aspect of the invention, the driver control circuit for each of the output drivers is connected to the central control circuit by a single signal line, and in response to a signal from the central control circuit on the signal line each of the drivers is independently calibrated at substantially the same time. In accordance with yet another aspect, the drivers are separated into a plurality of groups, and the groups serially connected together. The output drivers in each group can be calibrated at substantially the same time, and a handoff made from one group to the next group for calibration of the drivers in the next group.

These and other advantages and features of the invention will become more readily apparent from the following detailed description of the invention which is provided in connection with the accompanying drawings.

DETAILED DESCRIPTION OF THE PREFERRED EMBODIMENTS

The present invention will be described as set forth in the preferred embodiments illustrated in FIGS. 1–6. Other embodiments may be utilized and structural or logical changes may be made without departing from the spirit or scope of the present invention. Like items are referred to by like reference numerals.

In accordance with the present invention, the characteristics of multiple output drivers are independently adjusted or calibrated without significantly increasing the associated necessary circuitry.

Figure 1:
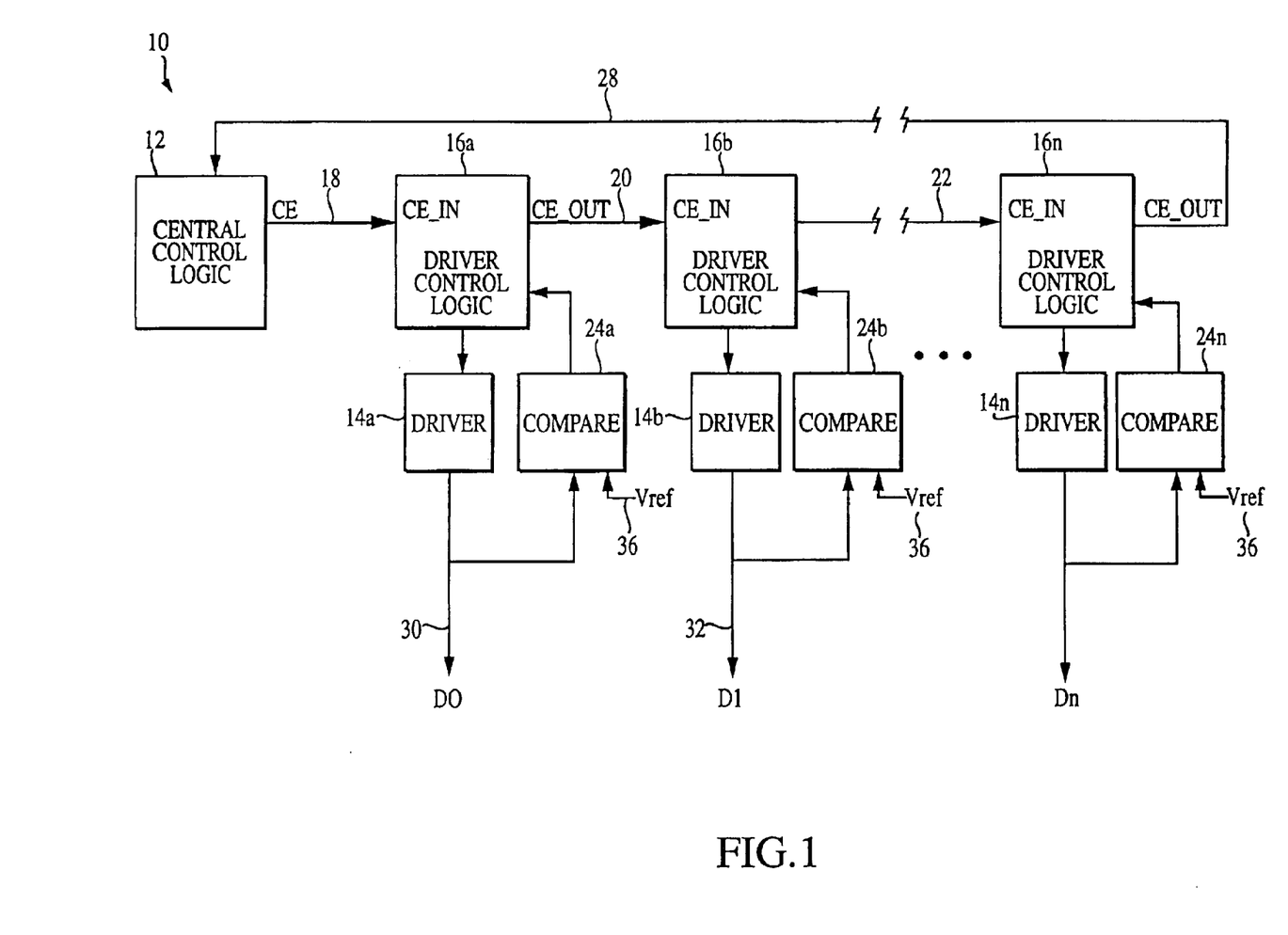
FIG. 1 illustrates in block diagram form a portion of an integrated circuit for independently calibrating the characteristics of multiple output drivers in accordance with a first embodiment of the present invention.

FIG. 1 illustrates in block diagram form a portion of an integrated circuit, particularly a calibration circuit 10, for independently calibrating or adjusting the characteristics of multiple output drivers in accordance with a first embodiment of the present invention. Circuit 10 includes a plurality of drivers 14a, 14b, 14n, as are known in the art. It should be understood that while only three drivers 14a, 14b, 14n are illustrated, the invention is not so limited and any number of drivers, as the system in which they are installed requires, can be used. Additionally, each driver need not be located on the same chip, as drivers from separate chips could be connected together for the purpose of calibration. Each driver 14a–14n is provided with a respective driver control logic circuit 16a–16n for determining adjustments to make to its associated driver. A central control logic circuit 12 is provided to initiate and coordinate the calibration process amongst the driver control logic circuits 16a–16n. Central control logic circuit 12 may be provided on the same chip as the drivers 14a–14n, or alternatively may be provided on a different chip than drivers 14a–14n. By utilizing central control logic circuit 12 to initiate and coordinate the calibration process, each of the driver control logic circuits 16a–16n can be simple logic circuits local to each driver.

The operation of circuit 10 is as follows. Central control logic circuit 12 will initiate the calibration process by providing a Calibration Enable (CE) signal on line 18 to the CE_IN input of driver control logic circuit 16a. When driver control logic circuit 16a receives the CE signal from central control logic circuit 12, it will enter into a calibration process for driver 14a. The calibration process includes turning on the pull-up and pull-down transistors (not shown) of driver 14a and increasing or decreasing the pull-up transistor size or the pull-down transistor size, as described below, to match the output of the driver 14a to a reference signal under a particular load condition. Increasing or decreasing the transistor size will change the current output and/or output voltage of the transistor accordingly.

When driver 14a is turned on, the output D0 30 is input to a compare circuit 24a where it is compared with a Vref signal 36. The signal Vref 36 can be generated on or off the same chip as circuit 10. An output signal from compare circuit 24a is input to driver control logic circuit 16a. The output signal from compare circuit 24a may be based, for example, on the levels of the driver output 30 and Vref 36. The driver control logic circuit 16a receives the output signal from compare circuit 24a and determines, based on the received signal, if an adjustment of the size of the transistors in the driver 14a is required. The transistors of driver 14a can be increased or decreased in strength, i.e., change the output current and/or output voltage, by either increasing or decreasing the effective width of the transistor as is well known in the art. Changing the driver strength may be performed, for example, by increasing or decreasing the number of gate fingers that are activated by the pre-driver circuit. Driver control logic circuit 16a will send an adjust signal to driver 14a to adjust the strength of the transistor of driver 14a accordingly. It should be understood that the adjust signal can include a single signal or a combination of signals.

Driver control circuit 16a will continue to adjust the output of driver 14a until the value of output 30 from driver 14a is approximately equal to the value of Vref 36, indicating that driver 14a is now calibrated. At this point, driver control logic 16a will assert a calibration signal CE_OUT on line 20, which is input to the CE_IN port of driver control logic 16b.

When driver control logic circuit 16b receives the calibration signal asserted from driver control logic circuit 16a, it will enter into a calibration process for driver 14b. The calibration process for driver 14b is similar to that of 14a. The output D1 32 from driver 14b is input to a compare circuit 24b where it is compared with the Vref signal 36. An output signal from compare circuit 24b is input to driver control logic circuit 16b which determines, based on the received signal, if an adjustment of the size of the transistors in the driver 14b is required.

Driver control logic circuit 16b will continue to adjust the output of driver 14b until the value of output 32 from driver 14b is approximately equal to the value of Vref 36, indicating that driver 14b is now calibrated. At this point, driver control logic circuit 16b will assert a calibration signal CE_OUT on line 22, which is input to the CE_IN port of the subsequent driver control logic in the sequence.

The driver calibration process as described above will continue until the final output driver in the sequence, i.e., driver 14n, has been calibrated. When driver 14n has been calibrated, driver control logic circuit 16n will assert a calibration signal CE_OUT on line 28 which is input to central control logic circuit 12. The input of the CE_OUT signal from driver control logic circuit 16n to central control logic circuit 12 indicates the calibration process is complete for all drivers. Alternatively, the CE_OUT signal on line 28 need not be provided to central control logic circuit 12, and the calibration process for all drivers can be assumed to be complete after some period of time predetermined by the number of drivers to be calibrated. Thus, in accordance with the present invention, the characteristics of output drivers 14a–14n can be independently calibrated, thereby improving the timing accuracy of the integrated circuit in which the drivers 14a–14n are located.

Figure 2:
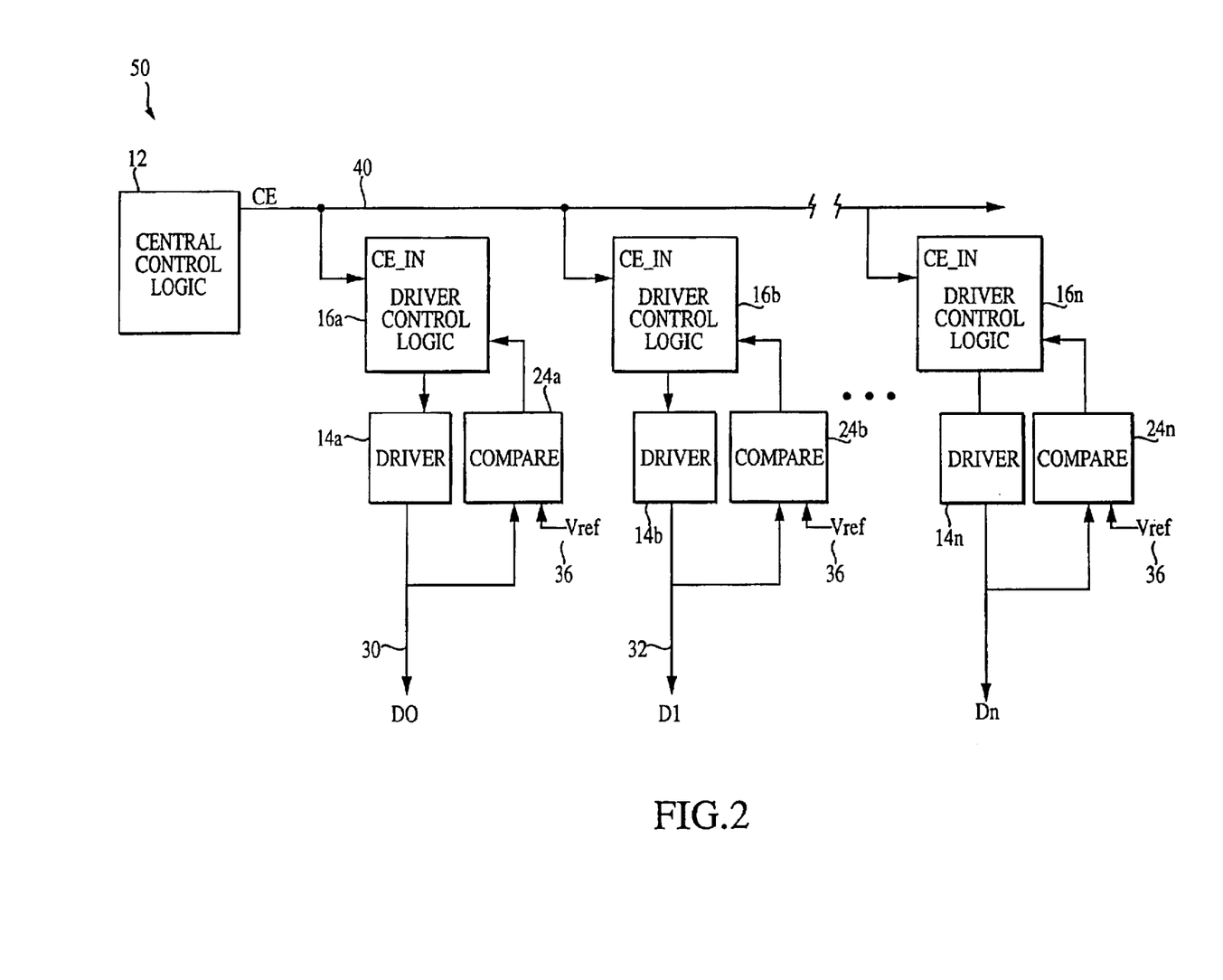
FIG. 2 illustrates in block diagram form a portion of an integrated circuit for independently calibrating the characteristics of multiple output drivers in accordance with a second embodiment of the present invention.

FIG. 2 illustrates in block diagram form a calibration circuit 50 for independently calibrating or adjusting the characteristics of multiple output drivers in accordance with a second embodiment of the present invention. Calibration circuit 50 is similar to calibration circuit 10 of FIG. 1, except each of the drivers 14a–14n are calibrated simultaneously in circuit 50, as described below, as opposed to sequentially in circuit 10.

Central control logic circuit 12 will initiate the calibration process by providing a Calibration Enable (CE) signal on line 40 to the CE_IN input of each driver control logic circuit 16a–16n. When the driver control logic circuits 16a–16n receive the CE signal from central control logic circuit 12, they will enter into a calibration process, as described above with respect to FIG. 1, for their associated drivers 14a–14n simultaneously. As noted, the calibration process includes turning on the pull-up and pull-down transistors (not shown) of the drivers 14a–14n and increasing or decreasing the pull-up transistor size or the pull-down transistor size to match the output of the drivers 14a–14n to a reference signal under a particular load condition. The calibration process for all drivers will be deemed complete after some predetermined period of time at which point the CE signal on line 40 will be disabled. As all drivers 14a–14n are calibrated simultaneously, the calibration process of circuit 50 requires less time than the circuit 10 of FIG. 1. The number of drivers 14a–14n that can be calibrated simultaneously may be limited, however, as the simultaneous turn-on of multiple drivers can result in large DC currents passing through the system.

Figure 3:
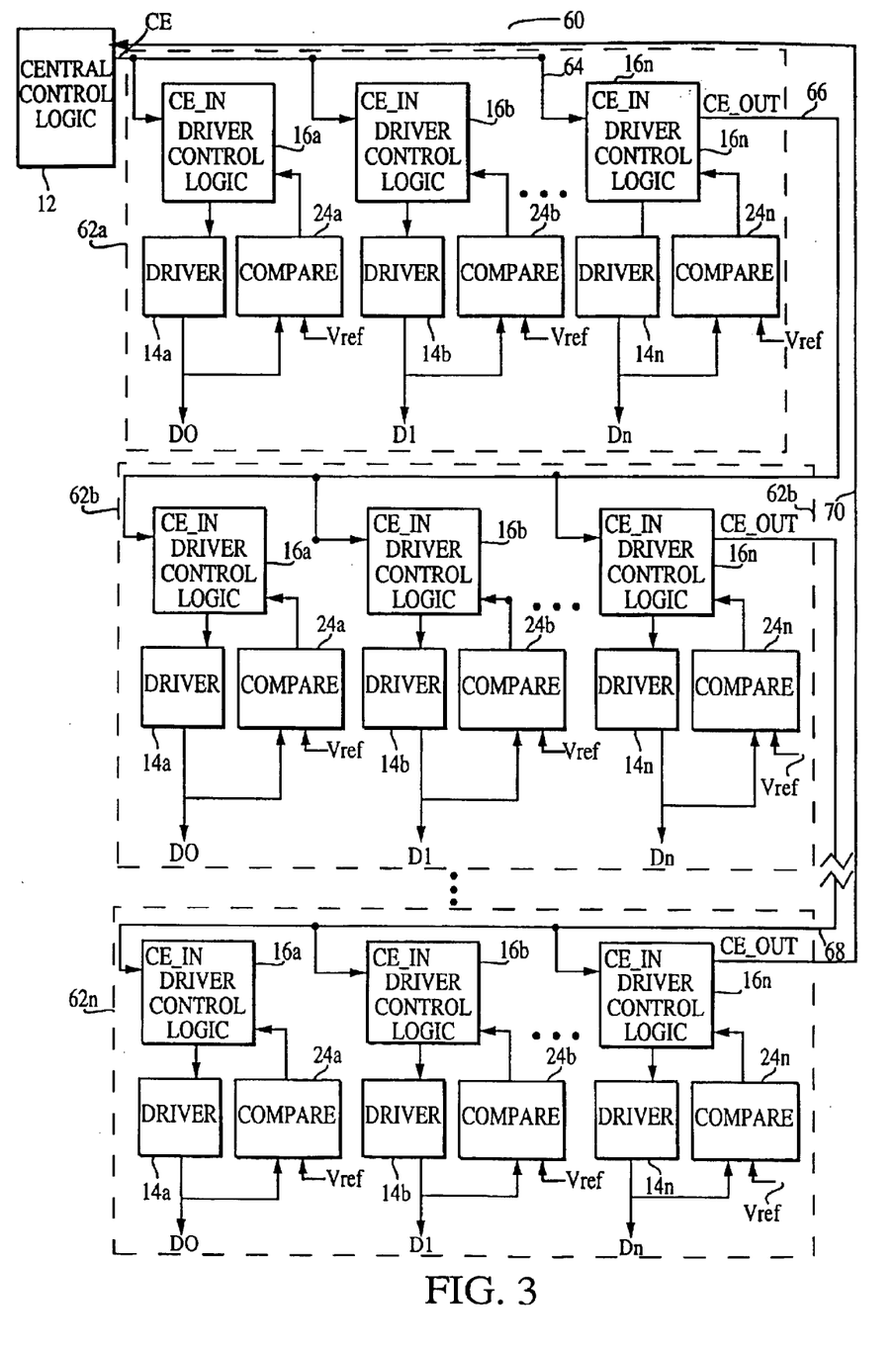
FIG. 3 illustrates in block diagram form a portion of an integrated circuit for independently calibrating the characteristics of multiple output drivers in accordance with a third embodiment of the present invention.

To limit the amount of DC current that may pass through the system caused by the turning-on of multiple drivers simultaneously, a number of drivers may be grouped together and the groups daisy chained together as illustrated in circuit 60 of FIG. 3. In circuit 60, a plurality of drivers 14a–14n are provided in a group, such as for example groups 62a, 62b, 62n. The number of drivers 14a–14n included in each group 62a–62n is determined such that the amount of DC current required by the simultaneous turn-on of all drivers 14a–14n in a respective group will remain below a predetermined threshold level. It should be understood that while three groups 62a, 62b, 62n are illustrated in FIG. 3, the invention is not so limited and any number of groups may be provided.

The operation of circuit 60 is as follows. Central control logic circuit 12 will initiate the calibration process by providing a Calibration Enable (CE) signal on line 64 to the CE_IN input of each driver control logic circuit 16a–16n of group 62a. When each of the driver control logic circuits 16a–16n of group 62a receive the CE signal from central control logic circuit 12, they will enter into a calibration process, as described above with respect to FIG. 2, for their associated drivers 14a–14n simultaneously. When the calibration process is complete for the last driver in group 62a, i.e., driver 14n, driver control logic circuit 16n will assert a calibration signal CE_OUT on line 66, which is input to the CE_IN port of each driver control logic circuit 16a–16n of group 62b. When each of the driver control logic circuits 16a–16n of group 62b receive the CE_OUT signal from group 62a, they will enter into a calibration process, as described above with respect to FIG. 1, for their associated drivers 14a–14n simultaneously. When the calibration process is complete for the last driver in group 62b, i.e., driver 14n, driver control logic circuit 16n will assert a calibration signal CE_OUT on line 68, which is input to the CE_IN port of each driver control logic circuit 16a–16n of the next subsequent group.

The driver calibration process as described above will continue, with all drivers in a group being calibrated simultaneously, until the final group of drivers, i.e., group 62n, has been calibrated. When the last driver 14n of group 62n has been calibrated, driver control logic 16n of group 62n will assert a calibration signal CE_OUT on line 70 which is input to central control logic circuit 12. The input of the CE_OUT signal from group 62n on line 70 to central control logic circuit 12 indicates the calibration process is complete for all drivers in all groups. Alternatively, the CE_OUT signal on line 70 need not be provided to central control logic circuit 12, and the calibration process for all drivers in all groups can be assumed to be complete after some period of time predetermined by the number of groups and the number of drivers in each group that need to be calibrated. Thus, in accordance with this embodiment, a plurality of drivers can be calibrated simultaneously, while maintaining the current levels associated with turning-on each of the drivers in a group simultaneously within a predetermined acceptable limit.

Figure 4A:
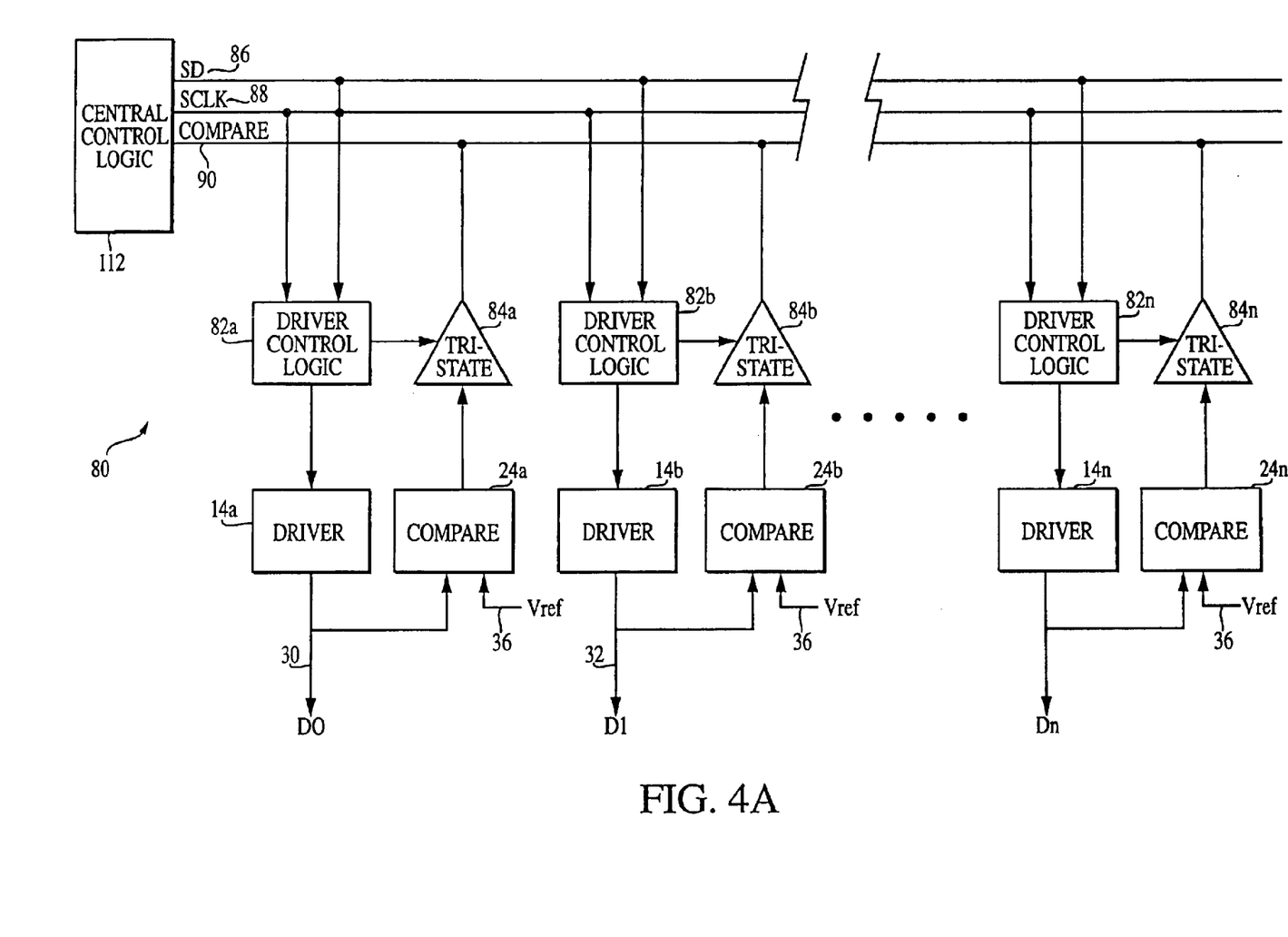
FIGS. 4A and 4B illustrate in block diagram form a portion of an integrated circuit for independently calibrating the characteristics of multiple output drivers in accordance with a fourth embodiment of the present invention.

FIG. 4A illustrates in block diagram form a circuit 80 for independently calibrating the characteristics of multiple output drivers in accordance with a fourth embodiment of the present invention. In circuit 80, the decision logic for adjusting each driver is located in the central control logic circuit 112, thus allowing for further simplification of each driver control logic circuit 82a–82n. In circuit 80, the output from each compare circuit 24a–24n is input to an associated tri-state buffer 84a–84n, which is enabled by the associated driver control logic circuit 82a–82n. The output of each tri-state buffer 84a–84n is connected to line 90, to provide a COMPARE signal back to central control logic circuit 112.

The operation of circuit 80 is as follows. Each of drivers 14a–14n are uniquely addressed by providing an address signal on the serial data pin (SD) line 86. The SD signal would provide all information to each of the drivers 14a–14n, which can be transmitted one bit at a time, in a serial format, using the SCLK clock signal on line 88 to latch the information into the drivers 14a–14n. For example, a first portion of information in the SD signal on line 86 would include the address of the driver, a second portion of information would include the command, such as for example enter calibration mode, increase pull-up, decrease pull-up, increase pull-down, decrease pull-down, or exit calibration mode. Thus, for example, when central control logic circuit 112 initiates a calibration process, an SD signal on line 86 will provide a unique address signal for one of the driver control logic circuits 82a–82n and an instruction to enter calibration mode for its respective driver 14a–14n. Upon receipt of the SD signal, the appropriate corresponding driver control logic circuit 82a–82n will activate the addressed driver 14a–14n to enter into calibration mode.

Thus for example, if calibration is to start with driver 14a, driver control logic circuit 82a will be activated to turn on the pull-up and pull-down transistors (not shown) of driver 14a. Driver control logic circuit 82a will also enable tri-state buffer 84a. The remaining driver control logic circuits 82b–82n remain inactive and the remaining tri-state buffers 84b–84n remain disabled. The output D0 30 from driver 14a is input to a compare circuit 24a where it is compared with a Vref signal 36 as described above with respect to FIG. 1. An output signal from compare circuit 24a is input to the tri-state buffer 84a, which, being enabled, outputs a COMPARE signal on line 90 into central control logic circuit 112. Central control logic circuit 112 uses the COMPARE signal on line 90 to determine any necessary adjustments for the driver 14a, and outputs the adjustment commands on SD line 86 to driver control logic circuit 82a. When driver 14a is calibrated, central control logic circuit 112 will command the driver control logic circuit 82a to exit the calibration mode, and driver control logic 82a will disable tri-state buffer 84a. Central control logic circuit 112 will now command a different driver control logic circuit 82b–82n to enter the calibration process and repeat the calibration as described above for driver 14a. This process will continue until all drivers 14a–14n have been calibrated.

Figure 4B:
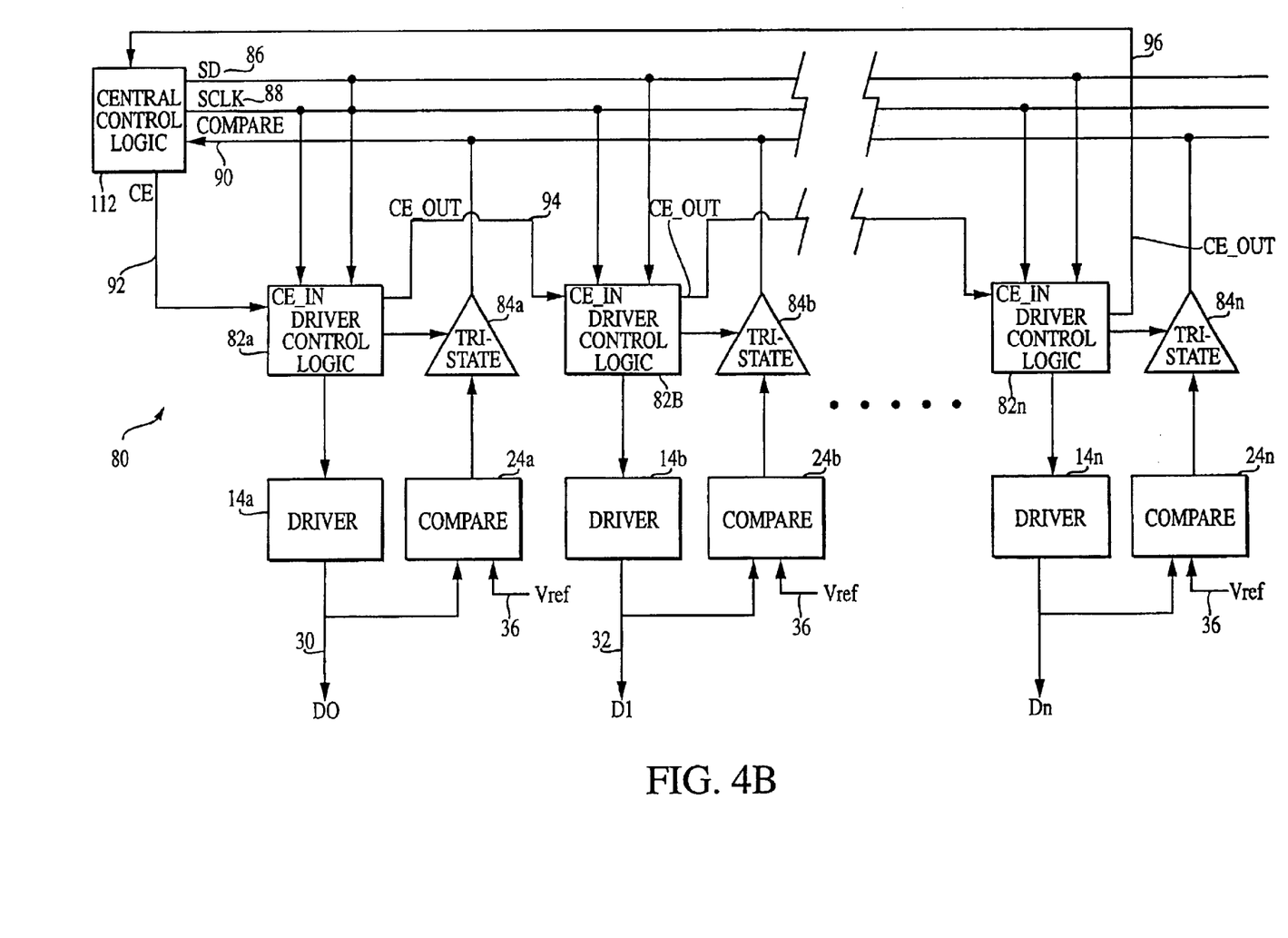

FIG. 4B illustrates an alternative circuit 80a for independently calibrating the characteristics of multiple output drivers in accordance with the fourth embodiment of the present invention. Circuit 80a is similar to circuit 80 of FIG. 4A, except a CE signal on line 92 is input from central control logic circuit 112 to driver control logic circuit 82a and daisy chain connected to the subsequent driver control logic circuits 82b–82n. The CE signal from central control logic circuit 112 replaces the address information provided as part of the SD signal on line 86. Thus, the SD signal on line 86 would include only the driver adjustment commands, such as for example increase pull-up, decrease pull-up, increase pull-down, or decrease pull-down. The only driver control logic circuit 82a–82n that would respond to the adjustment commands included in the SD signal would be that driver whose CE_IN pin is active and CE_OUT pin is inactive.

Thus, for example, when central control logic circuit 112 initiates a calibration process, it will assert a CE signal on line 92 to driver control logic 82a and send an enter calibration mode command in the SD signal on line 86. Driver control logic circuit 82a, having its CE_IN pin made active by the CE signal from central control logic circuit 112 and its CE_OUT pin inactive, will respond to the enter calibration command. The remaining driver control logic circuits 82b–82n remain inactive, as their CE_IN pins are not active. Driver 14a will be calibrated similarly as described above with respect to FIG. 4A, with central control logic circuit 112 using the COMPARE signal on line 90 to determine any necessary adjustments for the driver 14a, and outputting the adjustment commands on SD line 86. As only driver control circuit 82a is activated, only it will respond to the adjustment commands included in the SD signal. When driver 14a is calibrated, central control logic circuit 112 will send an exit calibration command on SD line 86. Driver control logic circuit 82a will then make its CE_OUT pin active by asserting a CE_OUT signal, which is conducted on line 94 and input to the next driver control logic circuit 82b, making the CE_IN pin of driver control logic circuit 82b active.

Driver control logic circuit 82b, upon having its CE_IN pin made active, will begin the calibration process for driver 14b. Only driver control logic circuit 82b will now respond to calibration commands included in the SD signal on line 86, as its CE_IN pin is active and its CE_OUT pin is inactive, while both the CE_IN and CE_OUT pin are active for driver logic control circuit 82a and the CE_IN pin for driver control logic circuit 82n is inactive. When driver 14b is calibrated, driver control logic circuit 82b will make its CE_OUT pin active, which is conducted on line 94 and input to the next subsequent driver control logic circuit, making the CE_IN pin of the next driver control logic circuit active.

The above process will continue until driver 14n has been calibrated. When driver 14n has been calibrated, driver control logic 82n will make its CE_OUT pin active by asserting a CE_OUT signal, which is input back to central control logic circuit 112 via line 96. The input of the CE_OUT signal from driver control logic circuit 82n to central control logic circuit 112 indicates the calibration process is complete for all drivers. Alternatively, the CE_OUT signal on line 96 need not be provided to central control logic circuit 112, and the calibration process for all drivers can be assumed to be complete after some period of time predetermined by the number of drivers to be calibrated.

Figure 5:
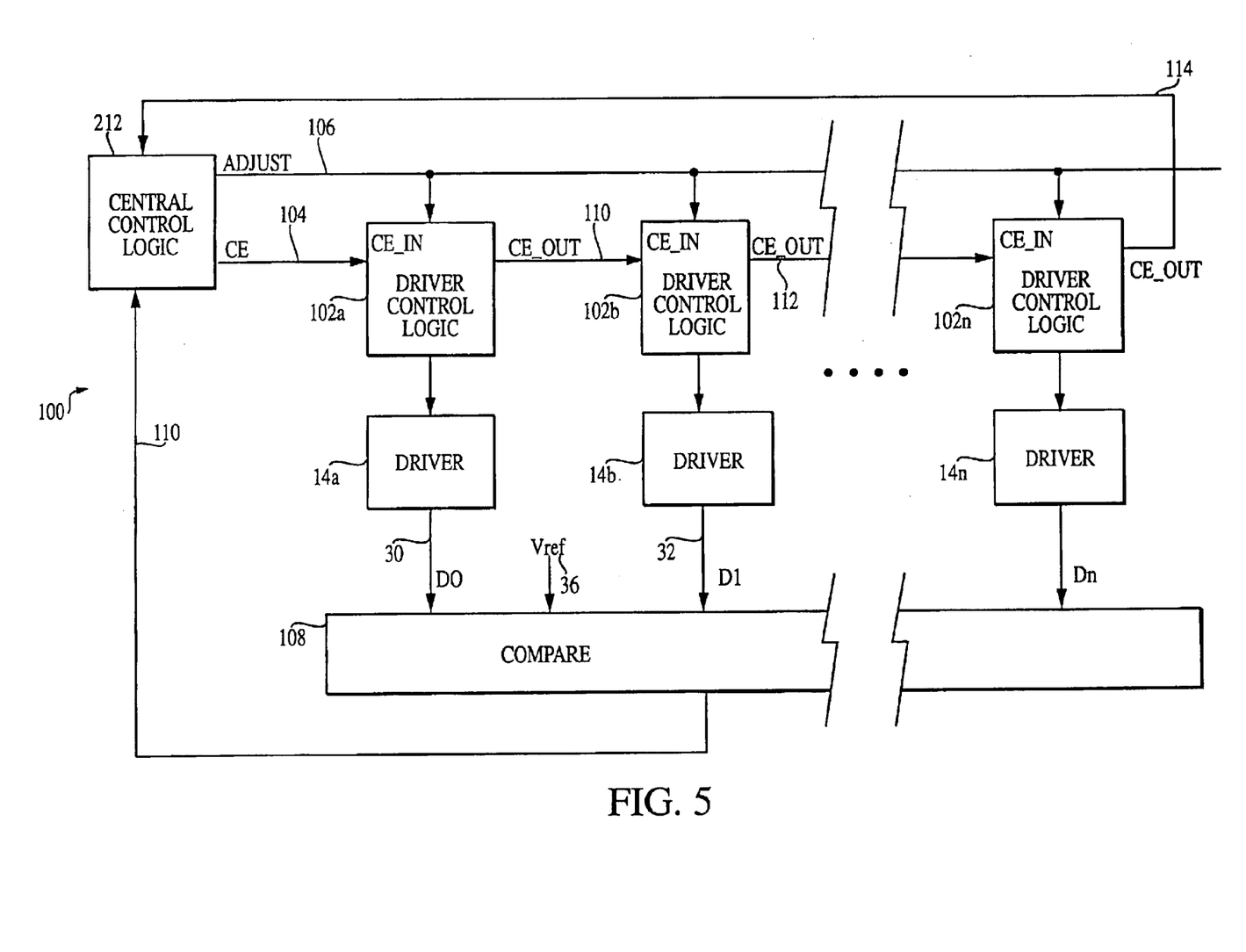
FIG. 5 illustrates in block diagram form a portion of an integrated circuit for independently calibrating the characteristics of multiple output drivers in accordance with a fifth embodiment of the present invention.

FIG. 5 illustrates in block diagram form a circuit 100 for independently calibrating the characteristics of multiple output drivers in accordance with a fifth embodiment of the present invention. Circuit 100 allows for further simplification of the driver control logic circuits 102a–102n, as all decision logic is included in the central control logic circuit 212, and a single compare circuit 108 is used for all drivers 14a–14b.

The operation of circuit 100 is as follows. Central control logic circuit 212 will initiate the calibration process by providing a Calibration Enable (CE) signal on line 104 to the CE_IN input of driver control logic circuit 102a. When driver control logic circuit 102a receives the CE signal from central control logic circuit 212, it will enter into a calibration process for driver 14a. The output D0 30 from driver 14a is input to a compare circuit 108 where it is compared with a Vref signal 36. An output signal from compare circuit 108 is input to central control logic circuit 212. The central control logic circuit 212 receives the output signal from compare circuit 108 and determines, based on the received signal, if an adjustment of the output D0 30 of driver 14a is required. Central control logic circuit 212 will output an adjust signal on line 106. The only driver control logic circuit 102a–102n that will respond to the adjustment commands would be that driver control logic circuit whose CE_IN pin is active and CE_OUT pin is inactive, i.e., driver control logic circuit 102a. Central control logic circuit 212 will continue to adjust the output of driver 14a until the value of output 30 from driver 14a is approximately equal to the value of Vref 36, indicating that driver 14a is now calibrated. At this point, central control logic circuit 212 will command driver control logic circuit 102a to exit the calibration mode, and driver control logic circuit 102a will assert a calibration signal CE_OUT on line 110, which is input to the CE_IN port of driver control logic 102b.

When driver control logic circuit 102b receives the calibration signal asserted from driver control logic circuit 102a, it will enter into a calibration process for driver 14b. The calibration process for driver 14b is similar to that of 14a. The output D1 32 from driver 14b is input to compare circuit 108 where it is compared with the Vref signal 36. An output signal from compare circuit 108 is input to central control logic circuit 212 which determines, based on the received signal, if an adjustment of the size of the transistors is required. Central control logic circuit 212 will output an adjust signal on line 106. Only driver control logic circuit 102b will respond to the adjustment commands, as it is the only driver control logic circuit whose CE_IN pin is active and CE_OUT pin is inactive.

Central control logic circuit 212 will continue to adjust the output of driver 14b until the value of output 32 from driver 14b is approximately equal to the value of Vref 36, indicating that driver 14b is now calibrated. At this point, central control logic circuit 212 will command driver control logic circuit 102b to exit the calibration mode, and driver control logic circuit 102b will assert a calibration signal CE_OUT on line 114, which is input to the CE_IN port of the subsequent driver control logic in the sequence.

The above process will continue until driver 14n has been calibrated. When driver 14n has been calibrated, driver control logic 102n will make its CE_OUT pin active by asserting a CE_OUT signal, which is input back to central control logic circuit 212 via line 116. The input of the CE_OUT signal from driver control logic circuit 102n to central control logic circuit 212 indicates the calibration process is complete for all drivers. Alternatively, the CE_OUT signal on line 116 need not be provided to central control logic circuit 212, and the calibration process for all drivers can be assumed to be complete after some period of time predetermined by the number of drivers to be calibrated.

Thus, in accordance with the present invention, the characteristics of output drivers 14a–14n can be independently calibrated, thereby improving the timing accuracy of the integrated circuit in which the drivers 14a–14n are located.

Figure 6:
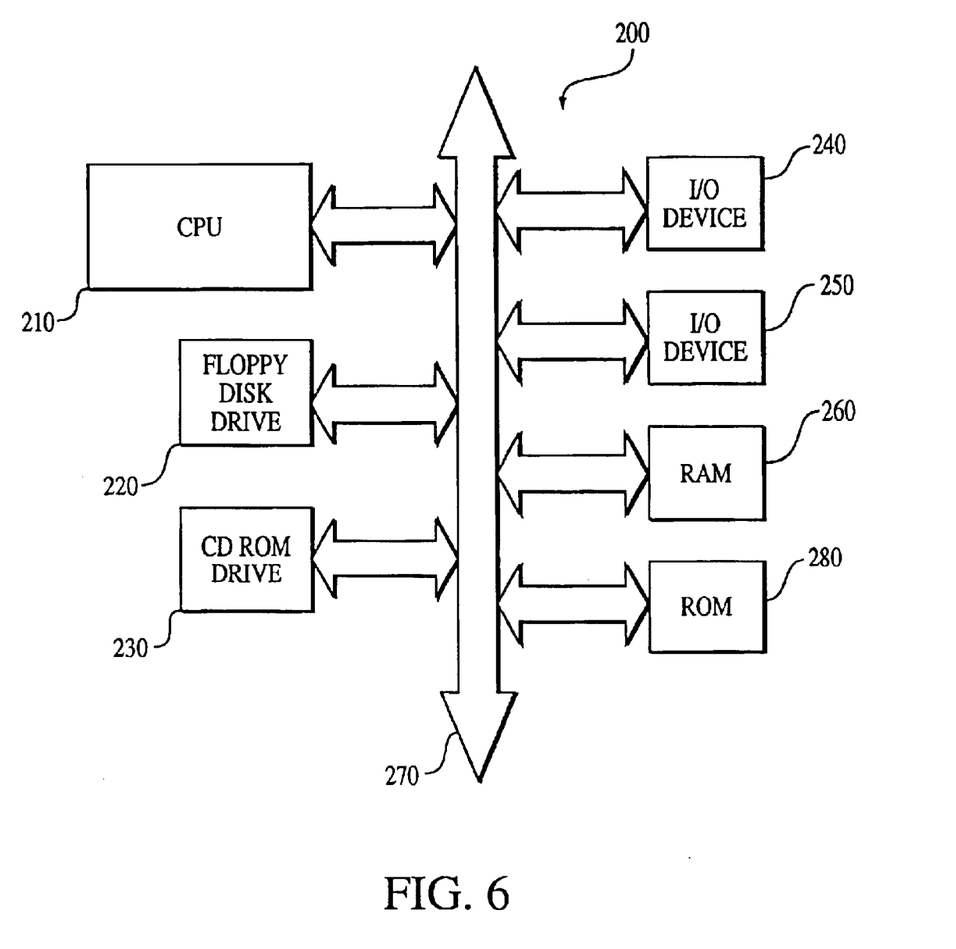
FIG. 6 illustrates in block diagram form a processor controlled system in which an integrated circuit that utilizes the multiple output driver calibration process according to the present invention is employed.

A typical processor based system which includes integrated circuits that utilize the calibration circuits according to the present invention for independently calibrating the characteristics of multiple output drivers is illustrated generally at 200 in FIG. 6. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, network switches, telephones and telephone systems also contain memory devices which can utilize the present invention.

A processor based system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) or Flash memory 280 and, in the case of a computer system may include peripheral devices such as a floppy disk drive 220 and a compact disk (CD) ROM drive 230 which also communicate with CPU 210 over the bus 270. At least one of CPU 210 and one or more integrated circuits connected thereto, such as employed for RAM 260 and ROM 280, are preferably constructed as integrated circuits which include a calibration circuit for independently calibrating the characteristics of multiple output drivers as previously shown and described with respect to FIGS. 1–5. It may also be desirable to integrate the processor 210 and memory 260 on a single IC chip and have one or both of processor 210 and memory 260 employ the calibration circuit shown and described with reference to FIGS. 1–5.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A method for independently calibrating a driver in each of a plurality of buffer circuits, said method comprising:

provided a control signal from a central control circuit to a driver control circuit associated with a first of said plurality of buffer circuits;

performing a calibration operation on a driver in said first of said plurality of buffer circuits in response to said control signal;

providing an output signal from said driver control circuit associated with said first of said plurality of buffer circuits when said calibration operation is complete.

2. The method according to claim 1, wherein each of said steps of performing a calibration operation respectively further comprise:

comparing an output of said driver calibrated to a reference signal to provide a respective result;

inputting said respective result to a respective driver control circuit associated with said driver being calibrated;

providing an adjust signal from said respective driver control circuit to said driver being calibrated, said adjust signal being based on said result; and adjusting said output of said driver being calibrated in response to said adjust signal.

3. The method according to claim 2, wherein said step of adjusting said output further comprises:

increasing and decreasing a relative size of at least one transistor in said driver being calibrated.

4. The method according to claim 2, wherein said step of adjusting said output further comprises:

increasing and decreasing an output current of at least one transistor in said driver being calibrated.

5. The method according to claim 2, wherein said step of adjusting said output further comprises:

increasing and decreasing an output voltage of at least one transistor in said driver being calibrated.

6. The method according to claim 2, wherein said step of comparing comprises:

utilizing a respective compare circuit associated with said respective driver control circuit to compare said output of said driver being calibrated and said reference signal.

7. The method according to claim 1, wherein each of said steps of performing a calibration operation respectively further comprises:

utilizing a compare circuit to compare an output of each of said driver being calibrated to a reference signal to provide a respective result;

inputting said respective result to said central control circuit;

providing an adjust signal from said central control circuit to a respective driver control circuit of said driver being calibrated, said adjust signal being based on said result; and adjusting said output of said driver being calibrated in response to said adjust signal.

8. The method according to claim 7, wherein said step of adjusting said output further comprises:

increasing and decreasing a relative size of at least one transistor in said driver being calibrated.

9. The method according to claim 7, wherein said step of adjusting said output further comprises:

increasing and decreasing an output current of at least one transistor in said driver being calibrated.

10. The method according to claim 7, wherein said step of adjusting said output further comprises:

increasing and decreasing an output voltage of at least one transistor in said driver being calibrated.

11. The method according to claim 1, wherein each of said steps of performing a calibration operation respectively further comprises:

comparing an output of said driver being calibrated with a reference signal to provide a respective result;

inputting said respective result to a buffer, said buffer having an output connected to an of said central control circuit;

enabling said buffer with a signal from said driver control circuit of said driver being calibrated; said buffer when enabled providing an output signal based on said result to said central control circuit;

providing an adjust signal from said central control circuit to said driver control circuit of said driver being calibrated, said central control circuit configuring said adjust signal based on said buffer signal; and adjusting said output of said driver being calibrated in response to said adjust signal.

12. The method according to claim 11, wherein said step of adjusting said output further comprises:

increasing and decreasing a relative size of at least one transistor in said driver being calibrated.

13. The method according to claim 11, wherein said step of adjusting said output further comprises:

increasing and decreasing an output current of at least one transistor in said driver being calibrated.

14. The method according to claim 11, wherein said step of adjusting said output further comprises:

increasing and decreasing an output voltage of at least one transistor in said driver being calibrated.

15. The method according to claim 11, wherein said step of providing an adjust signal further comprises:

using a clock signal to latch said adjust signal into said driver control circuit of said driver being calibrated.

* * * * *